(12) United States Patent
Dray et al.

(10) Patent No.: US 10,127,959 B2
(45) Date of Patent: Nov. 13, 2018

(54) SENSE AMPLIFIER

(71) Applicant: Intel IP Corporation, Santa Clara, CA (US)

(72) Inventors: Cyrille Dray, Antibes Juan les Pins (FR); El Mehdi Boujamaa, Valbonne (FR)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/443,972

(22) Filed: Feb. 27, 2017

(65) Prior Publication Data

US 2017/0169870 A1    Jun. 15, 2017

Related U.S. Application Data

(62) Division of application No. 14/864,702, filed on Sep. 24, 2015, now Pat. No. 9,601,165.

(51) Int. Cl.
    *G11C 7/06*        (2006.01)
    *G11C 11/16*     (2006.01)
    *G11C 13/00*     (2006.01)

(52) U.S. Cl.
    CPC .......... *G11C 11/1673* (2013.01); *G11C 7/065* (2013.01); *G11C 11/1675* (2013.01); *G11C 13/004* (2013.01); *G11C 2013/0054* (2013.01)

(58) Field of Classification Search
    CPC .................. G11C 7/065; G11C 13/004; G11C 2013/0042
    See application file for complete search history.

(56) References Cited

U.S. PATENT DOCUMENTS

| | | | |
|---|---|---|---|
| 4,907,201 A | 3/1990 | Minami et al. | |
| 5,049,758 A | 9/1991 | Mead et al. | |
| 6,157,578 A * | 12/2000 | Brady | G11C 7/065 |
| | | | 365/189.05 |
| 6,194,956 B1 | 2/2001 | Barnes | |

(Continued)

OTHER PUBLICATIONS

Jisu Kim et al.; "A Novel Sensing Circuit for Deep Submicron Spin Transfer Torque MRAM (STT-MRAM)"; IEEE Transactions on Very Large Scale Integration (VLSI) Systems, 2010, p. 181-186.

(Continued)

*Primary Examiner* — Khamdan Alrobaie
(74) *Attorney, Agent, or Firm* — Schwabe, Williamson & Wyatt, P.C.

(57) ABSTRACT

Embodiments include a sense amplifier circuit including first and second paths that may be selectively coupled to a memory cell or a reference cell as part of a two-phase read process. The sense amplifier may include a biasing circuit to provide an adaptive bias voltage to a transistor of the first and/or second path to cause the transistor to provide a voltage across the memory cell and/or reference cell that is substantially constant across process corners. Additionally, or alternatively, the sense amplifier may include a DC-coupled regenerative latch circuit to generate a digital output signal based on a voltage difference between nodes of the first and second paths at or near the end of the second phase. Additionally, or alternatively, trimmable offset resistors may adjust a resistance value provided to the sense amplifier by the memory cell and/or reference cells. Other embodiments may be described and claimed.

6 Claims, 4 Drawing Sheets

(56) References Cited

U.S. PATENT DOCUMENTS

| | | | |
|---|---|---|---|
| 6,212,109 B1* | 4/2001 | Proebsting | G11C 7/065 |
| | | | 257/E21.659 |
| 6,396,733 B1 | 5/2002 | Lu et al. | |
| 6,519,196 B1 | 2/2003 | Jang et al. | |
| 7,443,234 B2 | 10/2008 | Iriguchi | |
| 7,675,781 B2 | 3/2010 | Deml et al. | |
| 8,570,095 B1 | 10/2013 | Ryat | |
| 9,070,424 B2 | 6/2015 | Youn et al. | |
| 9,070,466 B2 | 6/2015 | Jefremow et al. | |
| 9,087,579 B1 | 7/2015 | Wu et al. | |
| 9,202,543 B2 | 12/2015 | Boujamaa et al. | |
| 2002/0101775 A1 | 8/2002 | Nojiri et al. | |
| 2003/0103395 A1 | 6/2003 | Ooishi | |
| 2004/0062074 A1 | 4/2004 | Ooish | |
| 2004/0136253 A1* | 7/2004 | Gupta | G11C 7/065 |
| | | | 365/205 |
| 2005/0237835 A1* | 10/2005 | Hung | G11C 7/065 |
| | | | 365/207 |
| 2006/0152262 A1 | 7/2006 | Park | |
| 2007/0085608 A1 | 4/2007 | Iriguchi et al. | |
| 2007/0200622 A1 | 8/2007 | Filoramo et al. | |
| 2012/0294090 A1 | 11/2012 | Chang et al. | |
| 2013/0201761 A1 | 8/2013 | Kim et al. | |
| 2013/0265820 A1 | 10/2013 | Chih et al. | |
| 2014/0153313 A1 | 6/2014 | Boujamaa et al. | |
| 2015/0055424 A1 | 2/2015 | Zhou et al. | |
| 2015/0187394 A1 | 7/2015 | Lee et al. | |

OTHER PUBLICATIONS

Christian C. Enz et al.; "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, p. 1584-1614.

T. M. Mathll et al.; "Design Considerations for MRAM", IBM J. Res. & Dev., vol. 50, No. 1, Jan. 2006, p. 25-39.

M. Hosomi et al.; "A Novel Nonvolatile Memory with Spin Torque Transfer Magnetization Switching: Spin-RAM", 2005 IEEE, p. 1-4.

T. Kawahara; "Non-Volatile Memory and Normally-Off Computing", ASP-DAC 2011, Jan. 26, 2011, Yokohama, Japan, p. 1-53.

International Search Report and Written Opinion dated Nov. 18, 2016 for International Application No. PCT/US2016/046801, 15 pages.

Notice of Allowance dated Nov. 9, 2016 for U.S. Appl. No. 14/864,702, 14 pages.

* cited by examiner

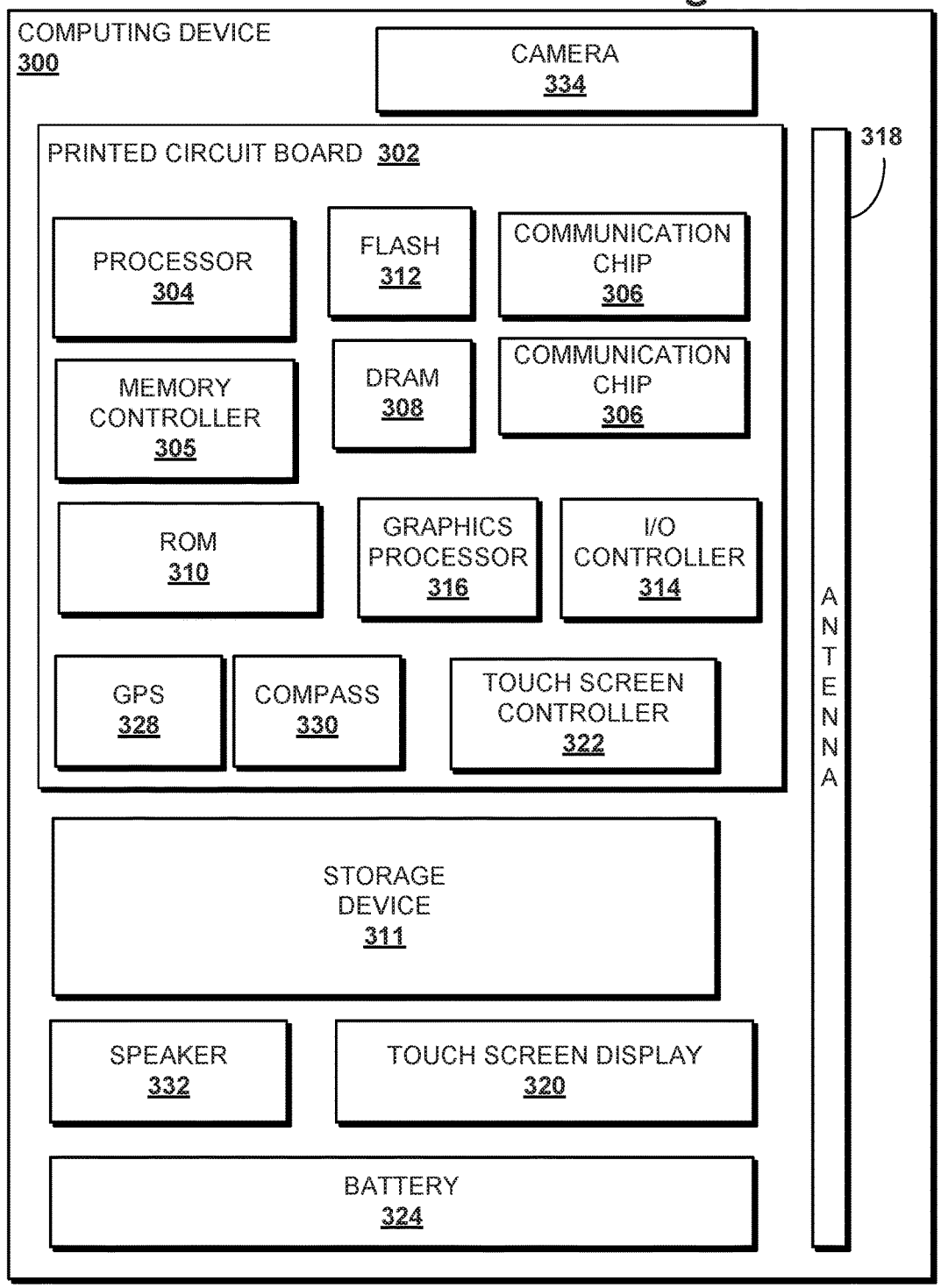

SENSE AMPLIFIER

CROSS REFERENCE TO RELATED APPLICATION

The present application is a divisional of U.S. patent application Ser. No. 14/864,702, filed Sep. 24, 2015, entitled "SENSE AMPLIFIER," the entire disclosure of which is hereby incorporated by reference in its entirety.

FIELD

Embodiments of the present invention relate generally to the technical field of electronic circuits, and more particularly to sense amplifiers.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

In resistive memory devices, such as magnetic random access memory (MRAM) devices, memory cells have a programmable resistance that is used to store data. For example, a memory cell may have a first resistance to store a bit having a first value or a second resistance to store a bit having a second value. The value of the bit stored by the memory cell may be read by dropping a voltage across the memory cell and reading the resulting current. For example, a sense amplifier may compare the current through the memory cell with a reference current.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 3 illustrates an example system configured to employ the apparatuses and methods described herein, in accordance with various embodiments.

DETAILED DESCRIPTION

Figure 1:
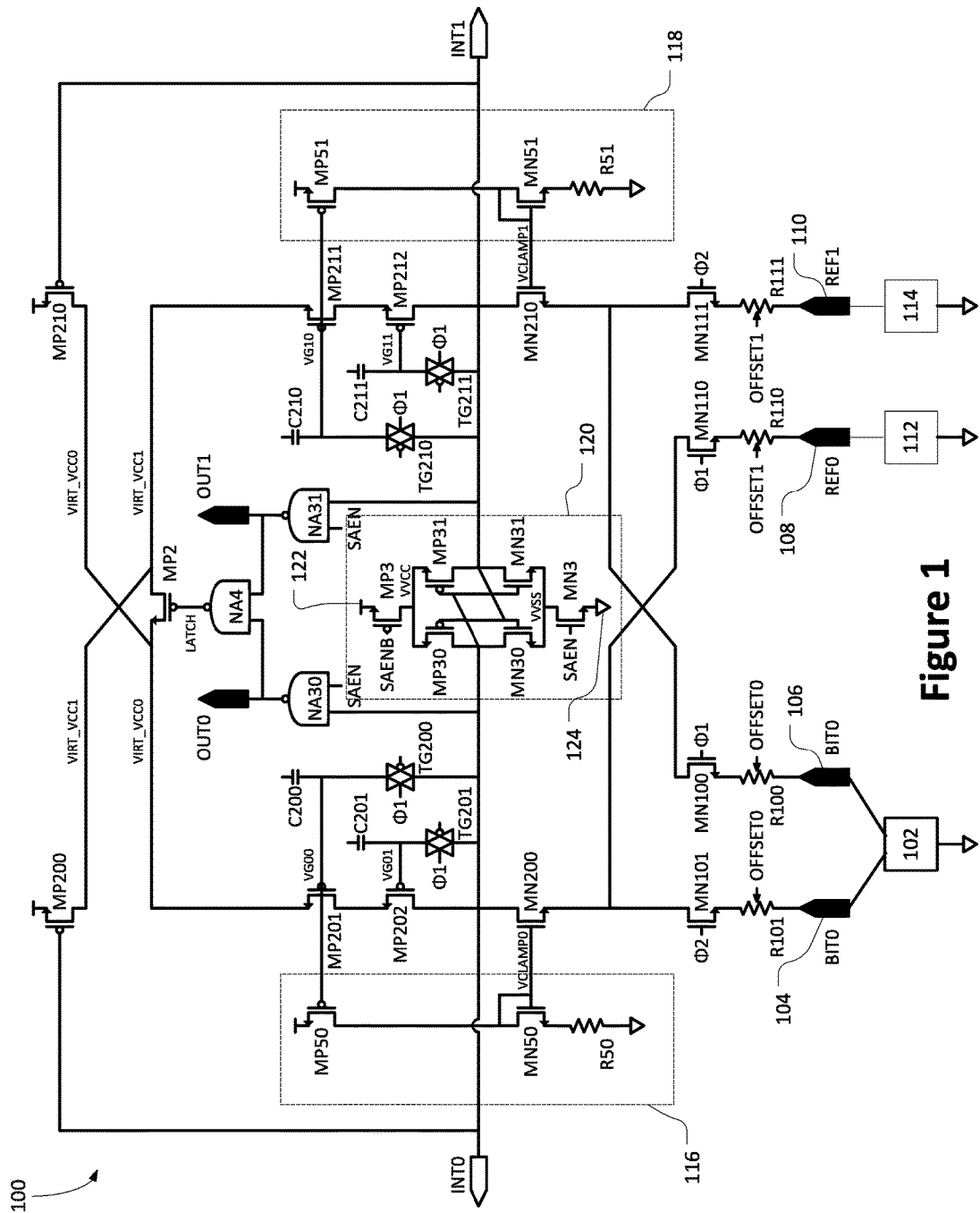
FIG. 1 schematically illustrates a sense amplifier in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments include a sense amplifier circuit to read a value of a bit stored by a memory cell. In some embodiments, the memory cell may be a resistive memory cell, such as a spin-transfer torque (STT) magnetic random access memory (MRAM) cell. The sense amplifier circuit may include a first signal path and a second signal path having respective first or second intermediate nodes disposed between respective transistors. During a first phase of the read operation, switch circuitry may selectively couple a first reference cell to the first signal path and selectively couple the memory cell to the second signal path. During a second phase of the read operation, the switch circuitry may selectively couple the memory cell to the first signal path and may selectively couple a second reference cell to the second signal path. The sense amplifier may generate a differential voltage between the first and second intermediate nodes having a value that is based on the value of the bit stored by the memory cell.

In various embodiments, the sense amplifier may include a biasing circuit to provide an adaptive clamp voltage to a transistor of the first and/or second path to cause the transistor to provide a voltage across the memory cell and/or reference cells that is substantially constant across process and supply voltage (Vcc) corners. Additionally, or alternatively, the sense amplifier may include a DC-coupled regenerative latch circuit to generate a digital output signal based on a voltage difference between the first and second intermediate nodes at or near the end of the second phase. The latch circuit may be DC-coupled between the intermediate nodes on the first and second paths. Additionally, or alternatively, the sense amplifier may include trimmable offset resistors coupled to the input terminals to adjust a resistance value provided to the sense amplifier by the memory cell and/or reference cells. The resistances of the trimmable offset resistors may be adjusted to balance read margins of the sense amplifier.

FIG. 1 illustrates a sense amplifier circuit 100 (hereinafter "circuit 100"), in accordance with various embodiments. The sense amplifier circuit 100 may be coupled to one or more memory cells (e.g., memory cell 102) of a memory to read data that is stored by the memory cells. The sense amplifier 100 may be included in a read circuit. In some embodiments, the memory cells may be resistive memory cells, such as spin-transfer torque (STT) magnetic random access memory (MRAM) cells, that store data based on a resistive state of the memory cells. For example, individual STT-MRAM memory cells may include a magnetic tunnel junction (MTJ) having a dielectric layer (e.g., oxide layer) disposed between a fixed magnet layer and a free magnet layer. The MTJ may store data according to the orientation of the free magnet. For example, the free magnet may be programmed to a parallel state with the fixed magnet layer to store a bit with a first logic value (e.g., logic 1) or an anti-parallel state with the fixed magnet layer to store a second logic value (e.g., a logic 0). The MTJ may have a higher resistance in the anti-parallel state than in the parallel state. The MTJ may be programmed to the parallel state or the anti-parallel state based on a direction of current that is passed through the MTJ during the write process.

In various embodiments, a memory cell 102 may be coupled to input data terminals 104 and 106 of the circuit 100. The circuit 100 may further include a first reference terminal 108 (REF0) and a second reference terminal 110 (REF1). The first reference terminal 108 may be coupled to a first reference cell 112, and the second reference terminal 110 may be coupled to a second reference cell 114. In some embodiments, the first reference cell 112 and second reference cell 114 may have different resistances. For example, the first reference cell 112 may have a lower resistance than the second reference cell 114. Alternatively, the first reference cell 112 may have a higher resistance than the second reference cell 114.

In some embodiments, the first reference cell 112 may have a resistance that corresponds to the low resistance state of the memory cell 102 (e.g., the resistance in the parallel state), and the second reference cell 114 may have a resistance that corresponds to the high resistance state of the memory cell 102 (e.g., the resistance in the anti-parallel state). Alternatively, the first reference cell 112 may have a resistance that corresponds to the high resistance state of the memory cell 102, and the second reference cell 114 may have a resistance that corresponds to the low resistance state of the memory cell 102. As discussed further below, the first reference cell 112 and second reference cell 114 may combine to provide a mid-point reference resistance that is between the low resistance state and the high resistance state of the memory cell 102.

In various embodiments, the circuit 100 may have a first path that includes transistors MP201, MP202, and MN200 that are coupled to one another in series along the first path, and a second path that includes MP211, MP212, and MN210 that are coupled to one another in series along the second path. As used herein, transistors designated as MP may be p-type transistors (e.g., p-type metal-oxide-semiconductor (PMOS)) transistors, and transistors designated as MN may be n-type transistors (e.g., n-type metal-oxide-semiconductor (NMOS) transistors). However, it will be apparent that different transistor types may be used in some embodiments without departing from the scope of the present disclosure.

In various embodiments, a first intermediate node INT0 may be disposed between the transistor MN200 and transistors MP202 and MP201 on the first path. A second intermediate node INT1 may be disposed between the transistor MN210 and transistors MP212 and MP211 on the second path.

In various embodiments, a switch transistor MN101 may be coupled between the first input data terminal 104 and transistor MN200 of the first path to selectively provide a conductive path between the memory cell 102 and the first path, and a switch transistor MN100 may be coupled between the second input data terminal 106 and transistor MN210 of the second path to selectively provide a conductive path between the memory cell 102 and the second path. The switch transistor MN100 may be controlled by a first control signal ($\Phi$1), and the switch transistor MN101 may be controlled by a second control signal ($\Phi$2).

A switch transistor MN110 may be coupled between the first reference terminal 108 and transistor MN200 of the first path to selectively provide a conductive path between the reference cell 112 and the first path, and a switch transistor MN111 may be coupled between the second reference terminal 110 and transistor MN210 of the second path to selectively provide a conductive path between the reference cell 114 and the second path. The switch transistor MN110 may be controlled by the first control signal $\Phi$1 and the switch transistor MN111 may be controlled by the second control signal $\Phi$2.

In various embodiments, the circuit 100 may further include a switch TG200 coupled between the gate terminal of the transistor MP201 and the drain terminal of transistor MP202, a switch TG201 coupled between the gate terminal and the drain terminal of the transistor MP202, a switch TG210 coupled between the gate terminal of the transistor MP211 and the drain terminal of transistor MP212, and/or a switch TG211 coupled between the gate terminal and the drain terminal of transistor MP212. The switches TG200, TG201, TG210, and TG211 may be controlled by the first control signal $\Phi$1. The circuit 100 may further include a capacitor C200 coupled to the gate terminal of the transistor MP201, a capacitor C201 coupled to the gate terminal of the transistor MP202, a capacitor C210 coupled to the gate terminal of the transistor MP211, and a capacitor C211 coupled to the gate terminal of the transistor MP212.

In various embodiments, a bias circuit 116 may be coupled with the gate terminals of the transistor MP201 and transistor MN200. The bias circuit 116 may generate a bias voltage (also referred to as clamp voltage), Vclamp0, and pass the bias voltage to the gate terminal of the transistor MN200. The bias voltage may have a value that varies with process conditions of one or more transistors of the circuit 100. For example, in some embodiments, the bias circuit 116 may be a current mirror to copy the current through the transistor MP201 and pass the copied current through a transistor (e.g., a diode-connected transistor) to provide a voltage Vclamp0 at the gate terminal of the transistor MN200. The voltage Vclamp0 may be a constant voltage with a value that is based on the threshold voltage of the diode-connected transistor. Accordingly, the value of the voltage Vclamp0 may adjust to variation in threshold voltages across process corners.

For example, in some embodiments, the bias circuit 116 may include a transistor MP50 having a gate terminal that is coupled to the gate terminal of the transistor MP201, and a diode-connected transistor MN50 having a drain terminal and gate terminal coupled with the gate terminal of the transistor MN200. The transistor MP50 may copy the current of transistor MP201 and pass the copied current through the transistor MN50. The voltage Vclamp0 at the gate terminal of the transistor MN200 may be based on the threshold voltage of the transistor MN50. Accordingly, the voltage Vclamp0 may adapt to variation in the transistors of circuit 100 across process corners to provide a voltage at the source terminal of transistor MN200 that is more stable across process corners than using a pre-determined fixed value for the voltage Vclamp0.

In some embodiments, the bias circuit 116 may further include a resistor R50 coupled between the source terminal of the transistor MN50 and ground. Resistor R50 may be used to trim the value of Vclamp. Additionally, or alternatively, the resistors R50 of different sense amplifier circuits 100 that are coupled to different bit lines may have different resistance values to mimic the voltage drop that may occur across the bit lines.

In various embodiments, the circuit 100 may further include another bias circuit 118 coupled to the gate terminals of the transistors MP211 and MN210. For example, the bias circuit 118 may include transistor MP51, diode-connected transistor MN51, and/or resistor R51 coupled to one another as shown. The bias circuit 118 may copy the current of the transistor MP211 and pass the current through the transistor MN51 to generate a voltage Vclamp1 at the gate terminal of the transistor MN210. The value of the voltage Vclamp1 may be based on the threshold voltage of the transistor MN51.

In some embodiments, the gate terminal of the transistor MN210 may be coupled with the gate terminal of the transistor MN200. Accordingly, the voltages Vclamp0 and Vclamp1 may have a same value (e.g., that corresponds to an average of the voltage provided by transistor MN50 and the voltage provided by MN51). With the gate terminals of transistors MN200 and MN210 coupled together, the Vclamp0 and Vclamp1 voltages may be more stable.

In some embodiments, the gate terminals of the transistors MN200 and MN210 may additionally or alternatively be coupled to the gate terminals of the corresponding transistors in one or more other sense amplifier circuits of the read circuit (e.g., that are associated with other bitlines). However, coupling the gate terminals of the transistors MN200 and MN210 across multiple sense amplifier circuits brings the risk that a bit error in one sense amplifier circuit may cause bit errors for one or more of the other sense amplifier circuits.

Figure 2A:
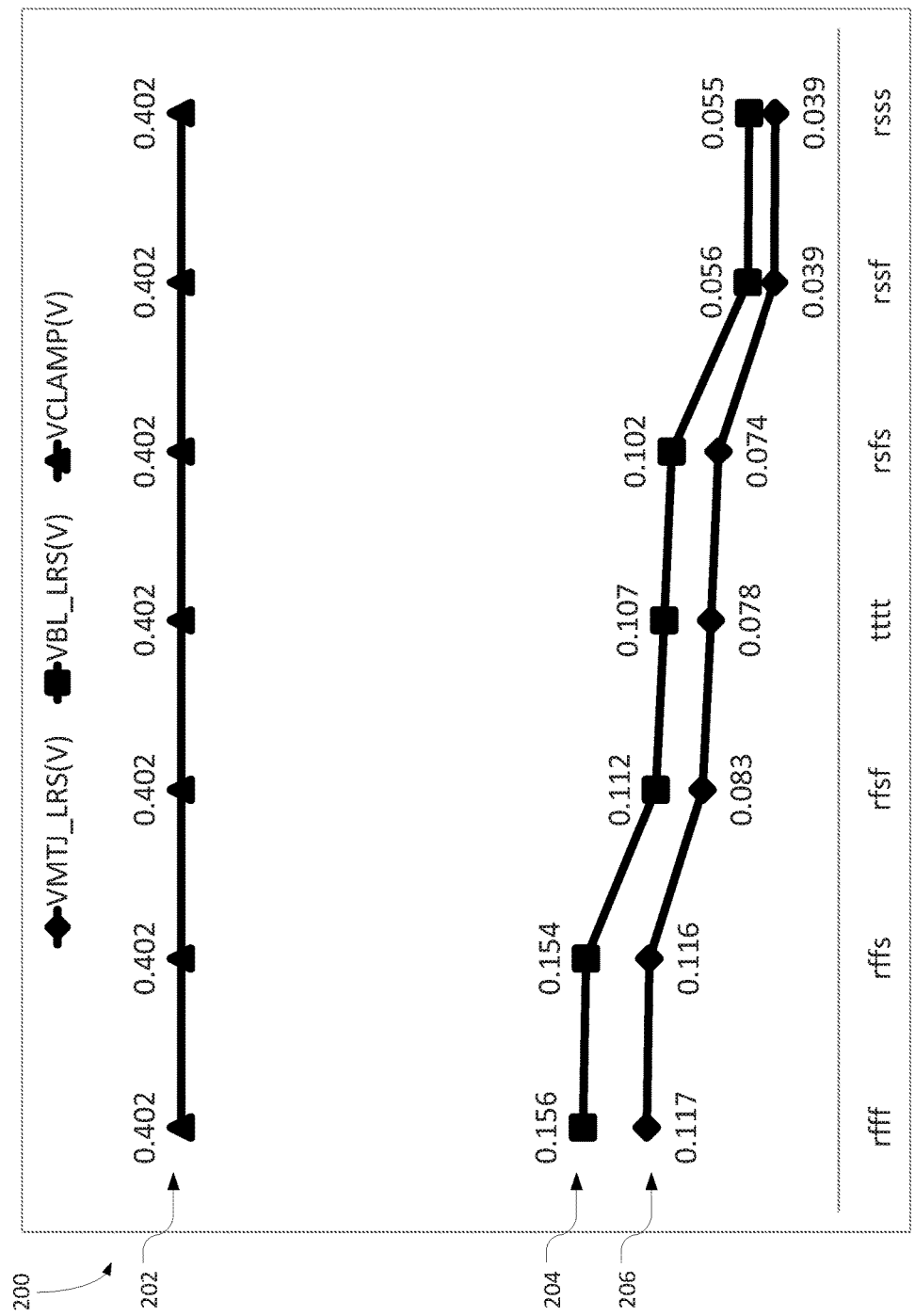
FIG. 2A is a graph showing values of a Vclamp voltage, a bitline voltage, and a magnetic tunnel junction (MTJ) voltage for a sense amplifier that uses a pre-determined fixed value for the Vclamp voltage, in accordance with various embodiments.

With the adaptive Vclamp0 and Vclamp1 voltages, the resulting voltage at the bitline (e.g., at input data terminals 104 and/or 106) and/or the resulting voltage that is dropped across the memory cell 102 may have less variation across process corners than if a pre-determined fixed value is used for the Vclamp0 and Vclamp1 voltages. For example, FIG. 2A illustrates a graph 200 showing values 202 for the Vclamp voltage, values 204 for the bitline voltage, and values 206 for the MTJ voltage for various process conditions for a sense amplifier circuit that uses a constant Vclamp voltage (e.g., 0.402 Volts) for all the process conditions. The values 204 for the bitline voltage vary from 0.156 Volts to 0.055 Volts, and the values 206 for the MTJ voltage vary from 0.117 Volts to 0.039 Volts.

Figure 2B:
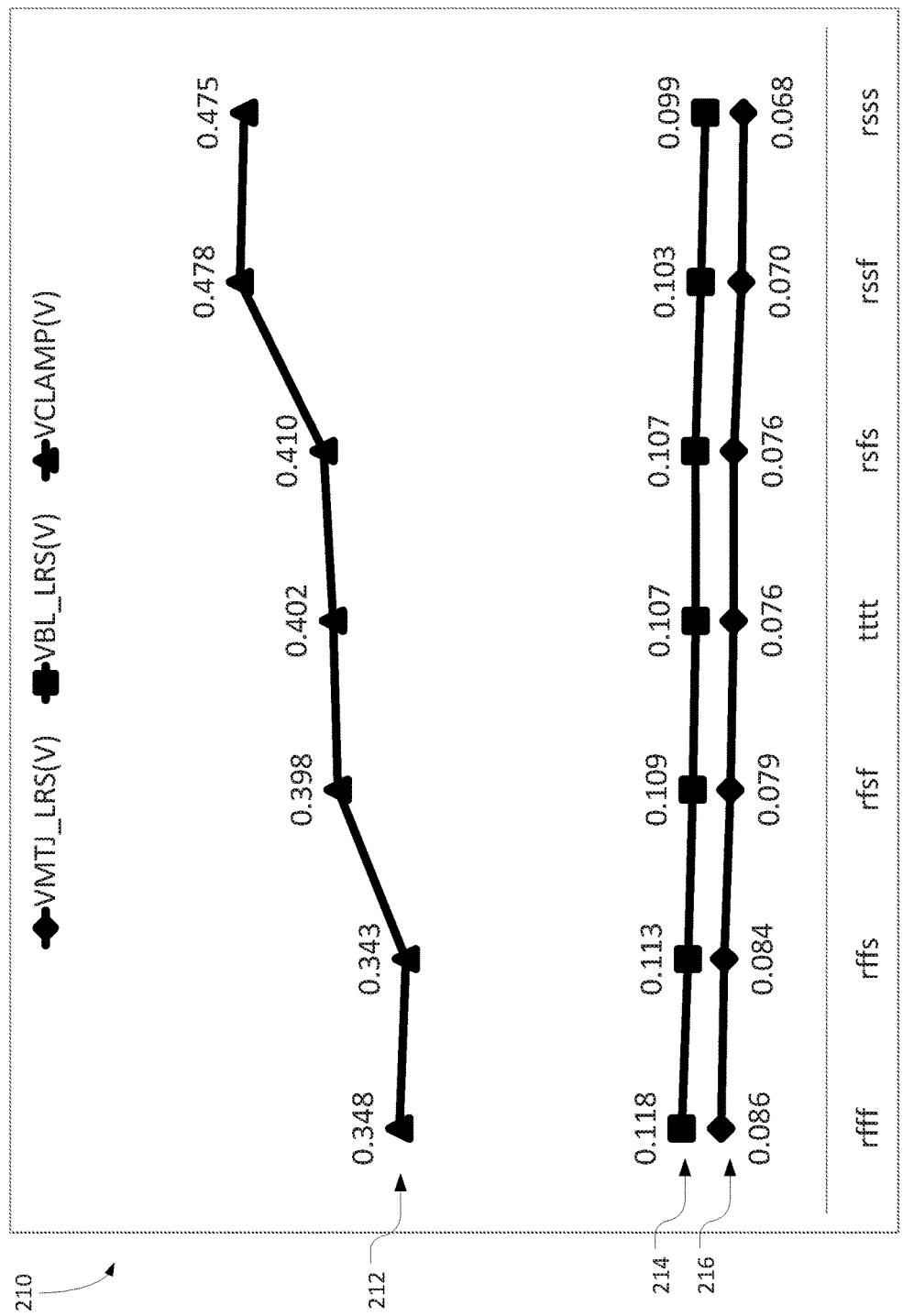
FIG. 2B is a graph showing values of a Vclamp voltage, a bitline voltage, and an MTJ voltage for a sense amplifier that uses an adaptive Vclamp voltage, in accordance with various embodiments.

FIG. 2B illustrates a graph 210 showing values 212 for the Vclamp voltage, values 214 for the bitline voltage, and values 216 for the MTJ voltage across various process conditions for a sense amplifier circuit that uses an adaptive Vclamp voltage as described herein (e.g., as provided by the current mirrors 116 and/or 118). The values 212 of the Vclamp voltage vary from 0.348 Volts to 0.475 Volts. The resulting values 214 of the bitline voltage vary from 0.118 Volts to 0.099 Volts, and the resulting values 216 of the MTJ voltage vary from 0.086 Volts to 0.068 Volts. Accordingly, as illustrated by FIGS. 2A and 2B, the values of the bitline voltage and MTJ voltage may be more consistent across process corners when using an adaptive Vclamp voltage than when using a fixed value for the Vclamp voltage.

In various embodiments, the circuit 100 may perform a multi-phase read process to determine the value of the bit stored by the memory cell 102. The multi-phase read process may cancel out signal offset that may be caused by variation in the transistors MP201, MP202, and MN200 on the first path and transistors MP211, MP212, and MN210 on the second path. The multi-phase read operation may include first and second phases. In some embodiments, the first phase may be referred to as a sampling phase, and the second phase may be referred to as an amplification phase.

During the first phase of the read process, the first control signal Φ1 may have a first logic value (e.g., logic high) to turn on switch transistors MN100 and MN110, and switches TG200, TG201, TG210, and TG211. The second control signal Φ2 may have a second logic value (e.g., logic low) such that transistors MN101 and MN111 are off. Accordingly, the reference cell 112 may be conductively coupled to the first path, and the memory cell 102 may be conductively coupled to the second path. Additionally, the capacitors C200 and C201 may be conductively coupled to the intermediate node INT0 by respective switches TG200 and TG201, and capacitors C210 and C211 may be conductively coupled to the intermediate node INT1 by respective switches TG210 and TG211. Therefore, the capacitors C200 and C201 may sample the current on the first path and store a corresponding charge. The current sampled by the capacitors C200 and C201 may correspond to the current through the reference cell 112. The capacitors C210 and C211 may sample the current on the second path and store a corresponding charge. The current on the second path may correspond to the current through the memory cell 102 (e.g., having a value based on the resistive state of the memory cell 102). A difference between the first current contribution of the first path and the second current contribution of the second path may be referred to as an offset current.

During the second phase of the read process, the first control signal Φ1 may have the second logic value such that transistors MN100 and MN110, and switches TG200, TG201, TG210, and TG211 are off. The second control signal Φ2 may have the first logic value such that switch transistors MN101 and MN111 are on (e.g., conducting). Accordingly, the memory cell 102 may be conductively coupled with the first path via the switch transistor MN101, and reference cell 114 may be conductively coupled with the second path via the switch transistor MN111.

The voltage provided by transistor MN200 (e.g., based on the bias voltage Vclamp0) may cause a current $I_{CELL}$ to pass through the memory cell 102. The charge stored by capacitors C200 and C201 may cause transistors MP201 and MP202 to provide a current $I_{REF0}$ that corresponds to the current through the first reference cell 112 in the first phase.

Accordingly, the voltage at the intermediate node INT0, V1 may be V1=$R_{OUT}$*($I_{REF0}$−$I_{CELL}$), where $R_{OUT}$ is the resistance seen at intermediate node INT0 (which may be the same as the resistance seen at intermediate node INT1).

The voltage provided by transistor MN210 may cause a current $I_{REF1}$ to pass through the reference cell 114. The charge stored by capacitors C210 and C211 may cause transistors MP211 and MP212 to provide a current that corresponds to the $I_{CELL}$ current through the memory cell 102 (as sampled during the first phase). Accordingly, the voltage at the intermediate node INT1, V2, may be V2=$R_{OUT}$*($I_{CELL}$−$I_{REF1}$).

Therefore, the voltage difference, ΔV, between the intermediate nodes INT0 and INT1 may be ΔV=V2−V1=2*($I_{CELL}$−($I_{REF0}$+$I_{REF1}$)/2)*$R_{OUT}$. The contribution from the offset voltage caused by differences in the first and second paths may be cancelled out. The voltage difference ΔV may be positive for the first resistive state of the memory cell and may be negative for the second resistive state of the memory cell.

In various embodiments, a latch circuit 120 may be direct current (DC) coupled between the intermediate nodes INT0 and INT1 (e.g., with a DC conductive path between the intermediate nodes INT0 and INT1 and the latch circuit 120). The latch circuit 120 may generate a digital output signal based on the voltage difference between the intermediate nodes INT0 and INT1 at the end of the second phase. For example, the latch circuit 120 may force one of the intermediate nodes INT0 or INT1 to a value corresponding to a logic 0 (e.g., a voltage of about 0 Volts (ground)) and may force the other of the intermediate nodes INT0 or INT1 to a value corresponding to a logic 1 (e.g., a voltage of about Vcc) based on the voltage difference ΔV. If the voltage at INT0 is higher than the voltage at INT1, the latch circuit 120 may force INT0 to a logic 1 and INT1 to a logic 0. If the voltage at INT0 is less than the voltage at INT1, the latch circuit 120 may force INT0 to a logic 0 and INT1 to a logic 1.

In some embodiments, the latch circuit 120 may include pull-up transistors MP30 and MP31, and pull-down transistors MN30 and MN31. The pull-up transistor MP30 may be coupled between the first intermediate node INT0 and a supply terminal 122, and pull-down transistor MN30 may be coupled between the first intermediate node INT0 and a ground terminal 124. The pull-up transistor MP31 may be coupled between the second intermediate node INT1 and the supply terminal 122, and pull-down transistor MN31 may be coupled between the second intermediate node INT1 and the ground terminal 124. The gate terminals of the transistors MP30 and MN30 may be coupled to the second intermediate node INT1 and the gate terminals of the transistors MP31 and MN31 may be coupled to the first intermediate node INT0.

In some embodiments, the latch circuit 120 may further include an enable transistor MP3 coupled between the pull-up transistors and the supply terminal 122 and an enable transistor MN3 coupled between the pull-down transistors MN30 and MN31 and the ground terminal 124. The enable transistor MN3 may receive an enable signal SAEN, and the enable transistor MP3 may receive an enable bar signal SAENB (which may be the inverse of the enable signal SAEN) to selectively activate the latch circuit 120. The enable signals SAEN and/or SAENB may activate the latch circuit 120 at or near the end of the second phase.

When the latch circuit 120 is activated, the contention from the cross-coupling of the transistors of the latch circuit 120 may force one of the intermediate nodes INT0 or INT1 to a value corresponding to a logic 0 (e.g., a voltage of about 0 Volts (ground)) and may force the other of the intermediate nodes INT0 or INT1 to a value corresponding to a logic 1 (e.g., a voltage of about Vcc) based on the voltage difference ΔV. For example, if the voltage at INT0 is higher than the voltage at INT1, the pull-up transistor MP30 may turn on (and the pull-down transistor MN30 may be off) to couple the node INT0 to the supply terminal 122 and bring the voltage at node INT0 to about Vcc. The pull-down transistor MN31 may turn on (and the pull-up transistor MP31 may be off) to couple the node INT1 to the ground terminal 124 and bring the voltage at node INT1 to about 0 Volts. Alternatively, if the voltage at INT0 is less than the voltage at INT1, the pull-down transistor MN30 may turn on (and the pull-up transistor MP30 may be off) to couple the node INT0 to the ground terminal 124 and bring the voltage at node INT0 to about 0 Volts. The pull-up transistor MP31 may turn on (and the pull-down transistor MN31 may be off) to couple the node INT1 to the supply terminal 122 and bring the voltage at the node INT1 to about Vcc.

The voltages at the intermediate nodes INT0 and INT1 may be passed as the output signal of the circuit 100 (e.g., at output terminals OUT0 and OUT1). In some embodiments, the circuit 100 may further include NAND gates NA30 and NA31. The input terminals of the NAND gate NA30 may be coupled with the first intermediate node INT0 and the enable signal SAEN, respectively. The input terminals of the NAND gate NA31 may be coupled with the second intermediate node INT1 and the enable signal SAEN, respectively. Accordingly, when the enable signal SAEN is on (e.g., high), the NAND gates NA30 and NA31 may pass an inverted version of the logic value at the respective intermediate node INT0 or INT1 to the respective output terminals OUT0 and OUT1.

The latch circuit 120 may be included in a second stage of the circuit 100 that generates a digital output signal based on the voltage difference ΔV generated at the intermediate nodes INT0 and INT1 by the first stage.

In various embodiments, the circuit 100 may further include a transistor MP2 (also referred to as a cutoff transistor) coupled between the source terminals of the transistors MP201 and MP211. A transistor MP200 may have a drain terminal coupled to the source terminal of the transistor MP211 of the second path, a gate terminal coupled to the first intermediate node INT0, and a source terminal coupled to receive the supply voltage (e.g., Vcc). A transistor MP210 may have a drain terminal coupled to the source terminal of the transistor MP201 of the first path, a gate terminal coupled to the second intermediate node INT1, and a source terminal coupled to receive the supply voltage. The transistors MP200 and MP201 may provide common mode feedback to regulate the voltage levels at the intermediate nodes INT0 and INT1.

In various embodiments, the transistor MP2 may receive a latch signal to turn off the transistor MP2 at the end of the second phase of the read process. In some embodiments, a NAND gate NA4 may have input terminals coupled to the respective output terminals OUT0 and OUT1 and an output terminal coupled to the gate terminal of the transistor MP2 to provide the latch signal. When the second stage is activated, the output terminals OUT0 and OUT1 may be driven to 0 and 1 or 1 and 0, respectively, causing the NAND gate NA4 to turn off transistor MP2. Accordingly, the DC path between the first stage and second stage may be cut off.

Furthermore, the resistance, Rdson, between the drain and source terminals of the transistor MP2 when the transistor MP2 is on may introduce a controlled positive feedback to enhance the gain of the first stage and thereby increase the voltage difference between the intermediate nodes INT0 and INT1 generated by the first stage. Accordingly, the input offset requirements of the second stage may be relaxed.

In some embodiments, the circuit 100 may further include trimmable resistors coupled between the memory cell 102, reference cell 112, and/or reference cell 114 and the respective switch transistors MN101, MN100, MN110, and MN111. For example, circuit 100 may include a resistor R100 coupled between the transistor MN100 and the input data terminal 106, a resistor R101 coupled between transistor MN101 and input data terminal 104, a resistor R110 coupled between the transistor MN110 and the reference terminal 108, and/or a resistor R111 coupled between the transistor MN111 and the reference terminal 110. The values of the resistors R100, R101, R110, and/or R111 may be adjustable. For example, in some embodiments, the resistors R100 and R101 may have a first resistance value OFFSET0, and the resistors R110 and R111 may have a second resistance value OFFSET1. The resistance values of the resistors R100, R101, R110, and/or R111 may add to the resistance value of the corresponding memory cell 102, reference cell 112, or reference cell 114 to affect the value of the current through the memory cell 102, reference cell 112, or reference cell 114 during the read operation.

In various embodiments, the resistance values of the resistors R100, R101, R110, and/or R111 (e.g., OFFSET0 and OFFSET1) may be set to balance the read margins for reading a logic 1 bit and reading a logic 0 bit from the memory cell 102. For example, the resistance values of the resistors R100, R101, R110, and/or R111 may be determined such that a number and/or frequency of read errors for reading bits from the memory cell 102 is about the same for reading a logic 1 bit as for reading a logic 0 bit. The resistance values of the resistors R100, R101, R110, and/or R111 may be determined by a control circuit, such as memory controller 305 of system 300.

Although the circuit 100 is described herein with memory cell 102 being a resistive memory cell, the circuit 100 may be used to read data from other types of memory cells and/or sensors that may act as a current source at data input terminals 104 and 106. In embodiments in which the memory cell 102 acts as a current source, the offset resistors R100, R101, R110, and/or R111 may be replaced with current sources that are coupled in parallel with the respective memory cell or reference cell.

FIG. 3 illustrates an example computing device 300 that may employ the apparatuses and/or methods described herein (e.g., circuit 100), in accordance with various embodiments. As shown, computing device 300 may include a number of components, such as one or more processor(s) 304 (one shown) and at least one communication chip 306. In various embodiments, the one or more processor(s) 304 each may include one or more processor cores. In various embodiments, the at least one communication chip 306 may be physically and electrically coupled to the one or more processor(s) 304. In further implementations, the communication chip 306 may be part of the one or more processor(s) 304. In various embodiments, computing device 300 may include printed circuit board (PCB) 302. For these embodiments, the one or more processor(s) 304 and communication chip 306 may be disposed thereon. In alternate embodiments, the various components may be coupled without the employment of PCB 302.

Depending on its applications, computing device 300 may include other components that may or may not be physically and electrically coupled to the PCB 302. These other components include, but are not limited to, memory controller 305, volatile memory (e.g., dynamic random access memory (DRAM) 308), non-volatile memory such as read only memory (ROM) 310, flash memory 312, storage device 311 (e.g., a hard-disk drive (HDD)), an I/O controller 314, a digital signal processor (not shown), a crypto processor (not shown), a graphics processor 316, one or more antenna 318, a display (not shown), a touch screen display 320, a touch screen controller 322, a battery 324, an audio codec (not shown), a video codec (not shown), a global positioning system (GPS) device 328, a compass 330, an accelerometer (not shown), a gyroscope (not shown), a speaker 332, a camera 334, and a mass storage device (such as hard disk drive, a solid state drive, compact disk (CD), digital versatile disk (DVD)) (not shown), and so forth. In various embodiments, the processor 304 may be integrated on the same die with other components to form a System on Chip (SoC).

In some embodiments, the one or more processor(s) 304, flash memory 312, and/or storage device 311 may include associated firmware (not shown) storing programming instructions configured to enable computing device 300, in response to execution of the programming instructions by one or more processor(s) 304, to practice all or selected aspects of the methods described herein. In various embodiments, these aspects may additionally or alternatively be implemented using hardware separate from the one or more processor(s) 304, flash memory 312, or storage device 311.

In various embodiments, one or more components of the computing device 300 may include the circuit 100 described herein. For example, the circuit 100 may be included in the memory controller 305, processor 304, I/O controller 314, and/or another component of the computing device 300. In some embodiments, one or more of the DRAM 308, flash memory 312, ROM 310, and/or storage device 311 may include memory cells that may be read by the circuit 100.

The communication chips 306 may enable wired and/or wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth, and a second communication chip 306 may be dedicated to longer range wireless communications such as GPS, EDGE, GPRS, CDMA, WiMAX, LTE, Ev-DO, and others.

In various implementations, the computing device 300 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 300 may be any other electronic device that processes data.

Some non-limiting Examples of various embodiments are presented below.

Example 1 is a sense amplifier circuit comprising: a first path including a first transistor, a second transistor, and an intermediate node coupled between the first and second transistors; switch circuitry to selectively couple a reference cell to the first path during a first phase of a read operation and to selectively couple a memory cell to the first path during a second phase of the read operation to generate a voltage at the intermediate node that is indicative of a value of a bit stored by the memory cell; and a bias circuit coupled to the first and second transistors, the bias circuit to generate a first current based on a current through the first transistor and pass the first current through a third transistor to provide a bias voltage to a gate terminal of the second transistor.

Example 2 is the circuit of Example 1, wherein the third transistor is a diode-connected transistor.

Example 3 is the circuit of Example 2, wherein the bias circuit includes a fourth transistor with a gate terminal coupled to a gate terminal of the first transistor to copy the current of the first transistor.

Example 4 is the circuit of Example 1, wherein the intermediate node is a first intermediate node, wherein the bias circuit is a first bias circuit, wherein the bias voltage is a first bias voltage, and wherein the circuit further comprises: a second path including a fourth transistor, a fifth transistor, and a second intermediate node coupled between the fourth and fifth transistors; and a second bias circuit coupled to the fourth and fifth transistors, the second bias circuit to generate a second current based on a current through the fourth transistor and pass the second current through a sixth transistor to provide a second bias voltage to a gate terminal of the fifth transistor; wherein the switch circuitry is to selectively couple the memory cell to the second path during the first phase and is to selectively couple a second reference cell to the second path during the second phase.

Example 5 is the circuit of Example 4, wherein the gate terminals of the second and fifth transistors are coupled to one another such that the first bias voltage is the same as the second bias voltage.

Example 6 is the circuit of Example 4, further comprising a latch circuit that is direct current (DC) coupled between the first and second intermediate nodes, wherein the latch circuit is to selectively activate at or near the end of the second phase to generate a digital output signal based on a voltage difference between the first and second intermediate nodes.

Example 7 is the circuit of Example 6, wherein the latch circuit includes a first enable transistor coupled between pull-up transistors of the latch circuit and a supply terminal and a second enable transistor coupled between pull-down transistors of the latch circuit and a ground terminal, wherein the first and second enable transistors are to turn on to activate the latch circuit.

Example 8 is the circuit of Example 6, further comprising a cutoff transistor coupled between the first and second paths to turn off responsive to activation of the latch circuit.

Example 9 is the circuit of Example 8, wherein the cutoff transistor is to provide amplification gain to the first and second intermediate nodes during the second phase.

Example 10 is the circuit of any one of Examples 1 to 9, further comprising a first trimmable resistor coupled between the switch circuitry and the memory cell and a second trimmable resistor coupled between the switch circuitry and the reference cell.

Example 11 is the circuit of any one of Examples 1 to 9, wherein the memory cell is a resistive memory cell.

Example 12 is a memory circuit comprising: a memory cell; and a sense amplifier circuit coupled to the memory cell, wherein the sense amplifier circuit includes: a first path including a first intermediate node; a second path including a second intermediate node, wherein the sense amplifier circuit is to generate a voltage difference between the first and second intermediate nodes that corresponds to a value of a bit stored by the memory cell; and a latch circuit direct current (DC) coupled between the first and second intermediate nodes, wherein the latch circuit, when activated by an enable signal, is to generate a digital output signal based on the voltage difference between the first and second intermediate nodes.

Example 13 is the circuit of Example 12, wherein the latch circuit includes a first enable transistor coupled between pull-up transistors of the latch circuit and a supply terminal and a second enable transistor coupled between pull-down transistors of the latch circuit and a ground terminal, wherein the first and second enable transistors are to turn on responsive to the enable signal to activate the latch circuit after generation of the voltage difference.

Example 14 is the circuit of Example 13, wherein the pull-up transistors include: a first pull-up transistor having a drain terminal coupled to the first intermediate node and a gate terminal coupled to the second intermediate node; and a second pull-up transistor having a drain terminal coupled to the second intermediate node and a gate terminal coupled to the first intermediate node. Additionally, the pull-down transistors include: a first pull-down transistor having a drain terminal coupled to the first intermediate node and a gate terminal coupled to the second intermediate node; and a second pull-down transistor having a drain terminal coupled to the second intermediate node and a gate terminal coupled to the first intermediate node.

Example 15 is the circuit of any one of Examples 12 to 14, wherein the sense amplifier further includes a cutoff transistor coupled between the first and second paths to turn off responsive to activation of the latch circuit.

Example 16 is the circuit of Example 15, wherein the sense amplifier further includes: a first feedback transistor with a drain terminal coupled to a drain terminal of the cutoff transistor and a gate terminal coupled to the first intermediate node; and a second feedback transistor with a drain terminal coupled to a source terminal of the cutoff transistor and a gate terminal coupled to the second intermediate node.

Example 17 is the circuit of Example 15, wherein the sense amplifier further includes: first output logic coupled to the first intermediate node to selectively pass a first digital value based on the voltage at the first intermediate node responsive to the enable signal; second output logic coupled to the second intermediate node to selectively pass a second digital value based on the voltage at the second intermediate node responsive to the enable signal, wherein the second digital value is the inverse of the first digital value; and cutoff logic to receive the first and second digital values as inputs and having an output terminal coupled to a gate terminal cutoff transistor to turn off the cutoff transistor responsive to receipt of the first and second digital values.

Example 18 is a memory system comprising: a resistive memory including a resistive memory cell; a reference cell having a first resistance; a sense amplifier coupled to the resistive memory cell and the reference cell, the sense amplifier to read data from the resistive memory cell based on the reference cell; a first trimmable resistor coupled between the sense amplifier and the resistive memory cell; a second trimmable resistor coupled between the sense amplifier and the reference cell; and a control circuit to adjust resistance values of the first trimmable resistor and the second trimmable resistor to equalize read margins between a logic 0 read and a logic 1 read of the memory cell.

Example 19 is the system of Example 18, wherein the reference cell is a first reference cell, wherein the system further comprises: a second reference cell with a second resistance that is different from the first resistance; a third trimmable resistor coupled between the sense amplifier and the second reference cell; wherein the sense amplifier is to read the data from the resistive memory cell based on the first and second reference cells; and wherein the control circuit is to adjust a resistance value of the third trimmable resistor to equalize the read margins.

Example 20 is the system of Example 19, wherein the control circuit is to control the second and third trimmable resistors to have the same resistance value.

Example 21 is the system of Example 19, wherein the sense amplifier includes: a first path including a first intermediate node; a second path including a second intermediate node; and switch circuitry. The switch circuitry is to: during a first phase of the read, couple the first reference cell to the first path and couple the resistive memory cell to the second path; and during a second phase of the read, couple the resistive memory cell to the first path and couple the second reference cell to the second path to generate a voltage difference between the first and second intermediate nodes that corresponds to a value of a bit stored by the resistive memory cell.

Example 22 is a memory apparatus comprising: means to, during a first phase of a read operation, couple a reference cell to a first path and couple a memory cell to a second path; means to, during a second phase of the read operation, couple the memory cell with the first path to generate a voltage difference between a first intermediate node on the first path and a second intermediate node on the second path that corresponds to a value of a bit stored by the memory cell; means to generate a bias voltage to control a first transistor of the first path to provide a voltage across the memory cell or reference cell and induce a current in the first path, the bias voltage having a value based on a threshold voltage of a second transistor.

Example 23 is the apparatus of Example 22, wherein the means to generate the bias voltage is to copy a current on the first path and pass the copied current through the second transistor to generate the bias voltage.

Example 24 is the apparatus of Example 22, further comprising means to adjust an offset resistance associated with the memory cell or the reference cell to balance read margins of the read operation.

Example 25 is the apparatus of any one of Examples 22 to 24, further comprising means to generate a digital output signal based on the generated voltage difference between the first and second intermediate nodes, wherein the means to generate the digital output signal are direct current (DC) coupled to the first and second intermediate nodes.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:
    a memory cell; and
    a sense amplifier circuit coupled to the memory cell, wherein the sense amplifier circuit includes:
        a first path including a first intermediate node;
        a second path including a second intermediate node, wherein the sense amplifier circuit is to generate a voltage difference between the first and second intermediate nodes that corresponds to a value of a bit stored by the memory cell;
        a latch circuit direct current (DC) coupled between the first and second intermediate nodes, wherein the latch circuit, when activated by an enable signal, is to generate a digital output signal based on the voltage difference between the first and second intermediate nodes;
        a cutoff transistor coupled between the first and second paths to turn off responsive to activation of the latch circuit;
        a first feedback transistor with a drain terminal coupled to a drain terminal of the cutoff transistor and a gate terminal coupled to the first intermediate node; and
        a second feedback transistor with a drain terminal coupled to a source terminal of the cutoff transistor and a gate terminal coupled to the second intermediate node.

2. The circuit of claim 1, wherein the latch circuit includes a first enable transistor coupled between pull-up transistors of the latch circuit and a supply terminal and a second enable transistor coupled between pull-down transistors of the latch circuit and a ground terminal, wherein the first and second enable transistors are to turn on responsive to the enable signal to activate the latch circuit after generation of the voltage difference.

3. The circuit of claim 2,
    wherein the pull-up transistors include:
        a first pull-up transistor having a drain terminal coupled to the first intermediate node and a gate terminal coupled to the second intermediate node; and
        a second pull-up transistor having a drain terminal coupled to the second intermediate node and a gate terminal coupled to the first intermediate node; and
    wherein the pull-down transistors include:
        a first pull-down transistor having a drain terminal coupled to the first intermediate node and a gate terminal coupled to the second intermediate node; and
        a second pull-down transistor having a drain terminal coupled to the second intermediate node and a gate terminal coupled to the first intermediate node.

4. A circuit comprising:
a memory cell; and
a sense amplifier circuit coupled to the memory cell, wherein the sense amplifier circuit includes:
a first path including a first intermediate node;
a second path including a second intermediate node, wherein the sense amplifier circuit is to generate a voltage difference between the first and second intermediate nodes that corresponds to a value of a bit stored by the memory cell;
a latch circuit direct current (DC) coupled between the first and second intermediate nodes, wherein the latch circuit, when activated by an enable signal, is to generate a digital output signal based on the voltage difference between the first and second intermediate nodes;
a cutoff transistor coupled between the first and second paths to turn off responsive to activation of the latch circuit;
first output logic coupled to the first intermediate node to selectively pass a first digital value based on the voltage at the first intermediate node responsive to the enable signal;
second output logic coupled to the second intermediate node to selectively pass a second digital value based on the voltage at the second intermediate node responsive to the enable signal, wherein the second digital value is the inverse of the first digital value; and
cutoff logic to receive the first and second digital values as inputs and having an output terminal coupled to a gate terminal cutoff transistor to turn off the cutoff transistor responsive to receipt of the first and second digital values.

5. The circuit of claim 4, wherein the latch circuit includes a first enable transistor coupled between pull-up transistors of the latch circuit and a supply terminal and a second enable transistor coupled between pull-down transistors of the latch circuit and a ground terminal, wherein the first and second enable transistors are to turn on responsive to the enable signal to activate the latch circuit after generation of the voltage difference.

6. The circuit of claim 5,
wherein the pull-up transistors include:
a first pull-up transistor having a drain terminal coupled to the first intermediate node and a gate terminal coupled to the second intermediate node; and
a second pull-up transistor having a drain terminal coupled to the second intermediate node and a gate terminal coupled to the first intermediate node; and
wherein the pull-down transistors include:
a first pull-down transistor having a drain terminal coupled to the first intermediate node and a gate terminal coupled to the second intermediate node; and
a second pull-down transistor having a drain terminal coupled to the second intermediate node and a gate terminal coupled to the first intermediate node.

* * * * *